US010026587B2

(12) United States Patent
Leyte Guerrero et al.

(10) Patent No.: US 10,026,587 B2
(45) Date of Patent: Jul. 17, 2018

(54) SAMPLE HOLDER FOR SCANNING ELECTRON MICROSCOPY (SEM) AND ATOMIC FORCE MICROSCOPY (AFM)

(71) Applicant: INSTITUTO MEXICANO DEL PETRÓLEO, Mexico City (MX)

(72) Inventors: Florentino Leyte Guerrero, México, D.F. (MX); Ubaldo Sadott Pacheco y Alcalá, México, D.F. (MX); David Velázquez Cruz, México, D.F. (MX); Galicia Mabel Acosta Garate, México, D.F. (MX)

(73) Assignee: Instituto Mexicano del Petróleo, Mexico City (MX)

( * ) Notice: Subject to any disclaimer, the term of this patent is extended or adjusted under 35 U.S.C. 154(b) by 0 days.

(21) Appl. No.: 15/374,969

(22) Filed: Dec. 9, 2016

(65) Prior Publication Data
US 2017/0169989 A1    Jun. 15, 2017

(30) Foreign Application Priority Data
Dec. 10, 2015    (MX) .................... MX/a/2015/016988

(51) Int. Cl.
*B82Y 35/00*    (2011.01)
*G01Q 60/38*    (2010.01)
*H01J 37/20*    (2006.01)
*G01Q 30/02*    (2010.01)
*G01Q 30/20*    (2010.01)
*H01J 37/28*    (2006.01)

(52) U.S. Cl.
CPC ............. *H01J 37/20* (2013.01); *G01Q 30/02* (2013.01); *G01Q 30/20* (2013.01); *H01J 37/28* (2013.01); *H01J 2237/2826* (2013.01)

(58) Field of Classification Search
CPC ........ B82Y 35/00; G01Q 60/38; G01Q 60/30; G01Q 60/24; G01Q 70/02; G01Q 70/04; Y01S 977/87; Y01S 977/863; G01B 11/02; G01B 9/02002
USPC .......................... 250/440.11, 441.11, 442.11
See application file for complete search history.

(56) References Cited

U.S. PATENT DOCUMENTS 7,230,719 B2 *    6/2007    Ng .......................... B82Y 35/00
                                                          356/501

OTHER PUBLICATIONS

Electron Microscopy Sciences, "Scanning Electron Microscope Supplies," <http://www.emsdiasum.com/microscopy/products/sem/holder.aspx> website available at least as early as Apr. 26, 2004.
(Continued)

*Primary Examiner* — David A Vanore
(74) *Attorney, Agent, or Firm* — Anne M. Reynolds; Casimir Jones, S.C.

(57) ABSTRACT

The present invention refers to a two-systems compact specimen holder (SH) easy to use which enables to analyze the same sample by employing either an atomic force microscope (AFM) or a scanning electron microscope (SEM), by preserving the setting reference of the details for both microscopies, so that it satisfies the requirements of size, conductivity, magnetization, tidiness, reference and adaptability.

The capacity of preserving the location reference of the details for both microscopies, in the scope of correlational microscopy, results essential to obtain information and images in both fields of microscopy, which can be correlated in order to acquire valuable combined information.

7 Claims, 7 Drawing Sheets

(56) References Cited

OTHER PUBLICATIONS

Agar Scientific "SEM Specimen Stubs & Mounts," <http://www.agarscientific.com/sem/specimen-stubs-mounts.html> website available at least as early as Jun. 13, 2013.
E. Fjeld Company, "Sample Holders and Accessories," <http://www.efjeld.com/P_S-hold.htm> website available at least as early as Aug. 8, 2003.
Ultra Tec Manufacturing, Inc., "SEM Stub Holders," <http://www.ultratecusa.com/sem-stub-holders> website available at least as early as Jun. 18, 2011.
Bowen et al., "Atomic Force Microscopy in Process Engineering", Butterworth-Heinemann. Amsterdam, Netherlands 2009.
Flegler et al., "Scanning and Transmission Electron Microscopy, an Introduction", Oxfrod University Press,New York, EUA 1993.
Li et al., "Introduction to Micromechanics and Nanomechanics", World scientific New Jersey, EUA 2008.
Rickerby et al., "Impact of Electron and Scanning Probe Microscopy on Materials Research," Academic Publishers. In cooperation with NATO Scientific Affairs Division. Dordrecht, Netherlands 1999.

\* cited by examiner

SAMPLE HOLDER FOR SCANNING ELECTRON MICROSCOPY (SEM) AND ATOMIC FORCE MICROSCOPY (AFM)

CROSS-REFERENCE TO RELATED APPLICATION(S)

This claims priority to Mexican Patent Application No. MX/a/2015/016988, filed on Dec. 10, 2015, the entire contents of which are fully incorporated herein by reference.

TECHNICAL FIELD

This invention refers to a sample holder (SH), which allows analyzing a single specimen in both, atomic force microscopy (AFM) and scanning electron microscopy (SEM), by keeping the sample-features in the same positioning reference when the sample is inserted in either of the microscopy instruments.

Thus, the present invention is found in the field of devices and supplies used in both SEM and MFA.

BACKGROUND

Sample holders (SH) are devices used to support specimens to be analyzed by SEM and/or AFM and other microscopy techniques. Each of which uses SHs with very particular designs due to their characteristics and specific functionalities [1, 2], such that there is a wide variety of SHs, which not only hold the specimen but also add position, grip, sample size, sample shape, tilting and even confining pressure features. However, none of the existing SH allows studying the same sample in both SEM and AFM, maintaining the sample-features in the same positioning reference. This advantageous feature of keeping the same positioning reference in both microscopy techniques is essential to obtain relevant and complementary information within the correlational microscopy field [3].

Table No. 1 Presents the SHs more closely related to the present invention device features, existing in the market.

TABLE No. 1

SHs for SEM existing in the market, more closely related to the present invention device functionality.

| Device | Device features | Observations |
| --- | --- | --- |
| FIG. No. 1 | SH for irregular samples such as rock-fragments and other abnormal shapes (polymers, metals, etcetera) (http://www.emsdiasum.com/microscopy/products/sem/holder.aspx). | Designed to hold and insert irregularly shaped specimens; not suited for fragile and thin samples. |
| FIG. No. 2 | Holder for SH tailored for Hitachi ® SEM, designed for both, flat and irregular samples (http://www.ultratecusa.com/sem-stub-holders). | Too big to be inserted in an AFM stage. |
| FIG. No. 3 | SH for metallurgic samples although it may be used to sustain rock fragments, polymers and other materials previously prepared to fit in it. This SH includes a Phillips-type pin underneath and is aluminum made. (http://www.emsdiasum.com/microscopy/products/sem/holder.aspx). | It cannot be inserted in an AFM. |
| FIG. No. 4 | SH for SEM dual beam microscopes, designed to prepare samples on transmission electron microscopy (TEM) grids, includes a Phillips-type pin underneath and is aluminum made. (http://www.emsdiasum.com/microscopy/products/sem/holder.aspx). | It cannot be inserted in an AFM stage. |
| FIG. No. 5 | SH for SEM dual beam microscopes, designed to prepare samples on transmission electron microscopy (TEM) grids, includes a Phillips-type pin underneath and is aluminum made (http://www.emsdiasum.com/microscopy/products/sem/holder.aspx). | Even without the lower pin, it is too big to be inserted in an AFM stage. |
| FIG. No. 6 | SH for up to 7 mm thick flat samples used in SEM. It is aluminum made and includes bronze screws and a Phillips-type lower pin. (http://www.emsdiasum.com/microscopy/products/sem/holder.aspx). | The grip method may damage fragile samples and is unable to hold small specimens such as AFM specimens, besides is not convenient for AFM-SH and is not magnetic. |
| FIG. No. 7 | Conventional SH Phillips-type for SEM, its dimensions are 12.5 mm, 3.2 mm × 6.0 mm, aluminum made. (http://www.agarscientific.com/sem/specimen-stubs-mounts.html). | It requires double-sided tape, and cannot be inserted in an AFM stage. |
| FIG. No. 8 | SH Phillips-type for SEM with lower pin, tailored for acicular specimens such as fibers, wires and up to 17.5 mm long sheets and other. (http://www.efjeld.com/P_S-hold.htm). | It cannot be inserted in an AFM stage. because of its lower pin, and it is too tall for the stage. |
| FIG. No. 9 | SH designed for thin sheet-like samples such as paper, metallic films and wires no larger than 25.4 mm. (http://www.efjeld.com/P_S-hold.htm). | The SH cannot be inserted in an AFM stage because of its lower pin. |

As it can be seen from Table No. 1, The SEM-designed SHs can be so simple and practical or have a very sophisticated design, providing additional capabilities to support a sample. However, as far as the authors is concerned, none of the existing SHs allows to study the same sample in the same region in both SEM and AFM for the following reasons:

a) They are not designed to keep the same positioning reference when changing from SEM to AFM.
b) Their physical support can damage fragile samples.
c) They are too big to fit into the AFM stage.
d) Many of them require the use of electrons-conducting double sided tape to maintain the specimen in place, which is not acceptable in AFM imaging since the samples can become contaminated with the adhesive on the tape and introduce unexpected damping behavior during both, tapping or continuous imaging and micromechanical testing in AFM [4].

REFERENCES

[1] Bowen, W. R., Hilal, N. Eds. (2009) "Atomic Force Microscopy in Process Engineering", Butterworth-Heinemann. Amsterdam, Netherlands.
[2] Flegler, S. L., Heckerman, J. W., Klomparens, K. L. (1993) "Scanning and Transmission Electron Microsocpy, an Introduction", Oxfrod University Press, New York, EUA.
[3] Valdré, G. (1999) "Correlative Microscopy and Probing in Material Science", Last chapter of the book: Impact of Electron and Scanning Probe Microscopy on Materials Research. Rickerby, D. G., Valdré, G., Valdré, U. Kluwer Academic Publishers. In cooperation with NATO Scientific Affairs Division. Dordrecht, Netherlands.

[4] Shaofan L I, Gang Wang. (2008) "Introduction to Micromechanics and Nanomechanics", World scientific New Jersey, EUA.

The state of knowledge known by the applicant, represented mainly by the aforementioned devices, technically differs and is exceeded by the present invention, since the present-day knowledge does not report a compact sample holder, easy to use, which facilitates to study the same specimen in the same region in both, AFM and SEM, maintaining the same positioning reference in either microscopy techniques, and satisfying the requirements of size, conductivity, magnetization, cleanliness, referencing and adaptability.

Thus, and objective of the present invention is to provide a SH to analyze the same sample in both SEM and FMA satisfying the requirements of size, conductivity, magnetization, cleanliness, referencing and adaptability.

Another objective of the present invention is to provide a SH to analyze the same sample in both, SEM and AFM, keeping the same positional referencing of any region in the sample.

BRIEF DESCRIPTION OF DRAWING(S)

Note: Numbers in parenthesis ( ), refer to numbers on the figures.

(1)=SH for AFM or AFM-SH, magnetizable and conductive to electrons;

(2)=SH for SEM or SEM-SH, conductive to electrons; and (3)=attachment block.

Figure 1:
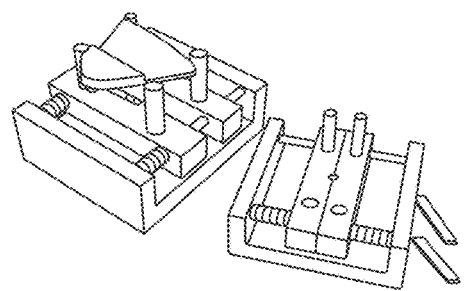
FIGS. 1 to 9 show sample holders (SH) for scanning electron microscopy existing in the market, which are more closely related to the functionality of the present invention.
Figure 2:
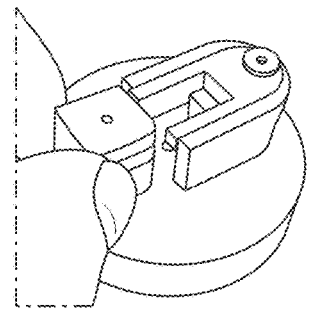
Figure 3:
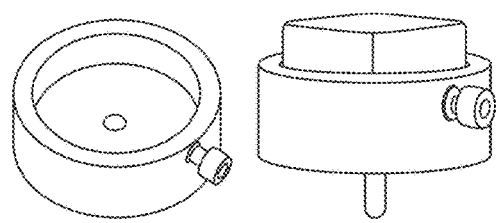
Figure 3:
Figure 4:
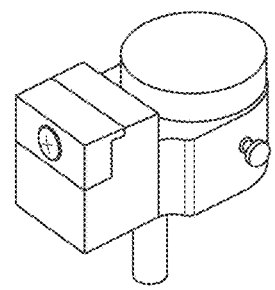
Figure 5:
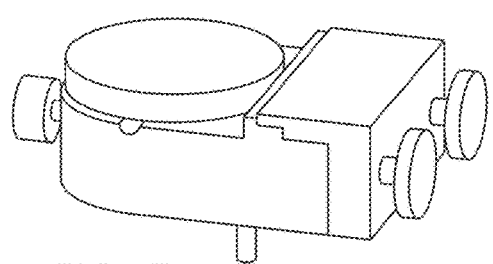
Figure 6:
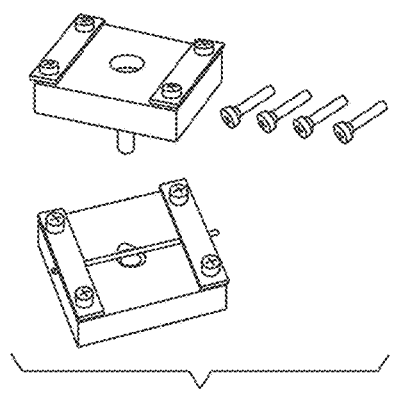
Figure 7:
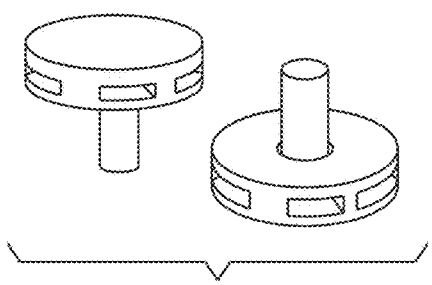
Figure 8:
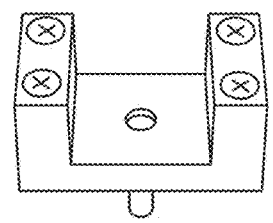
Figure 9:
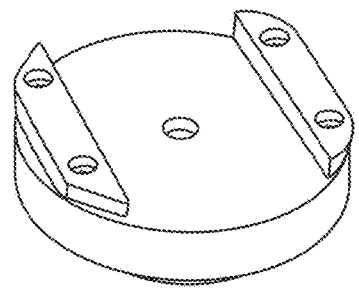
Figure 10:
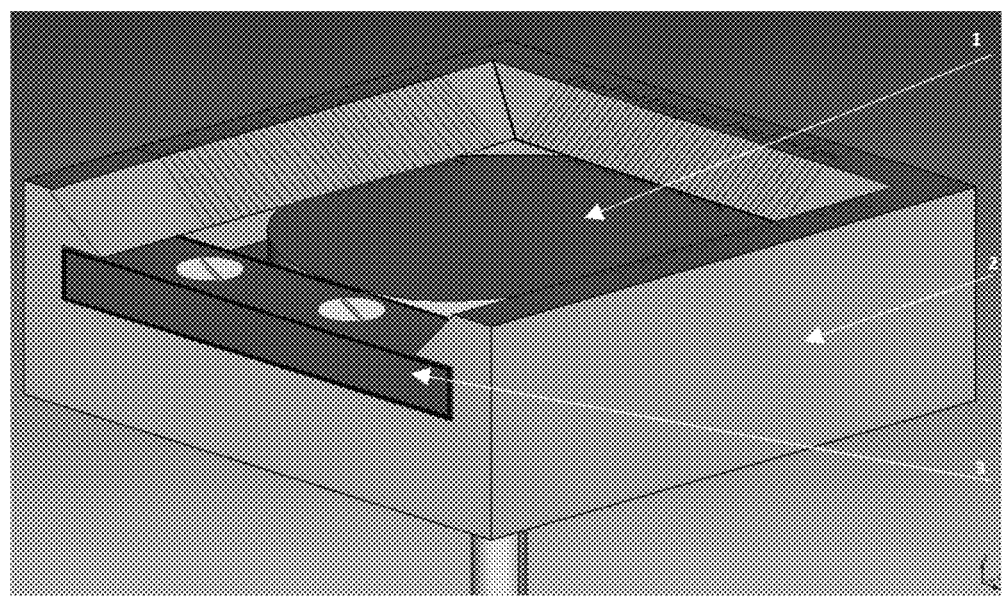
FIG. 10 shows the SH of the present invention with an attachment block (3), where.
Figure 11:
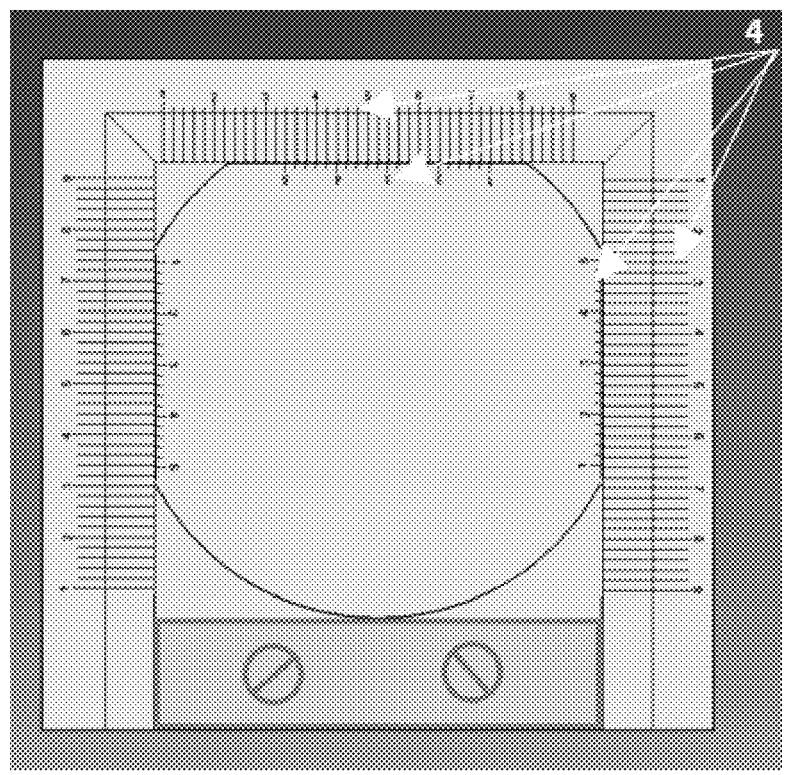

FIG. 11 shows the upper view of the present invention SH with attachment block, indicating the measuring scales for referencing in both, AFM-SH and SEM-FH (4).

Figure 12:
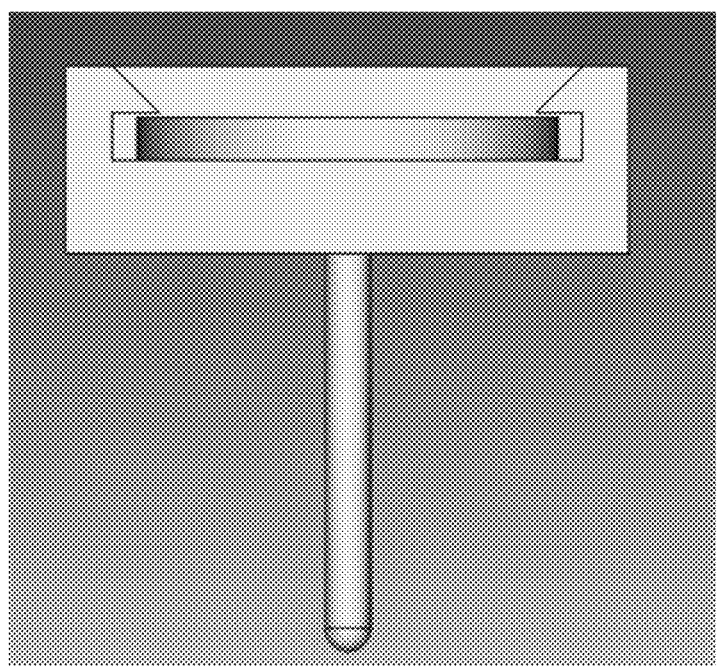

FIG. 12 shows the front view of SH of the present invention without attachment block and pin.

Figure 13:
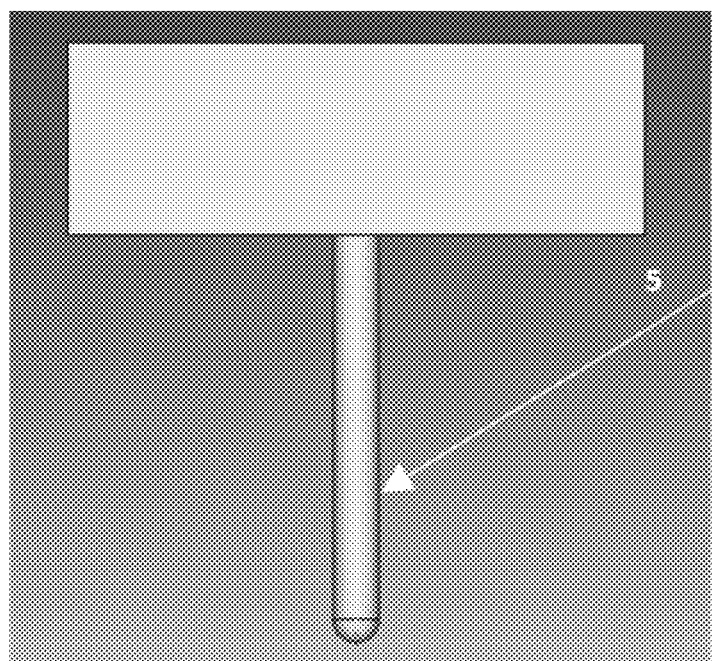

FIG. 13 shows the side view of SH of the present invention with attachment block, highlighting the Phillips-type support pin (5).

Figure 14:
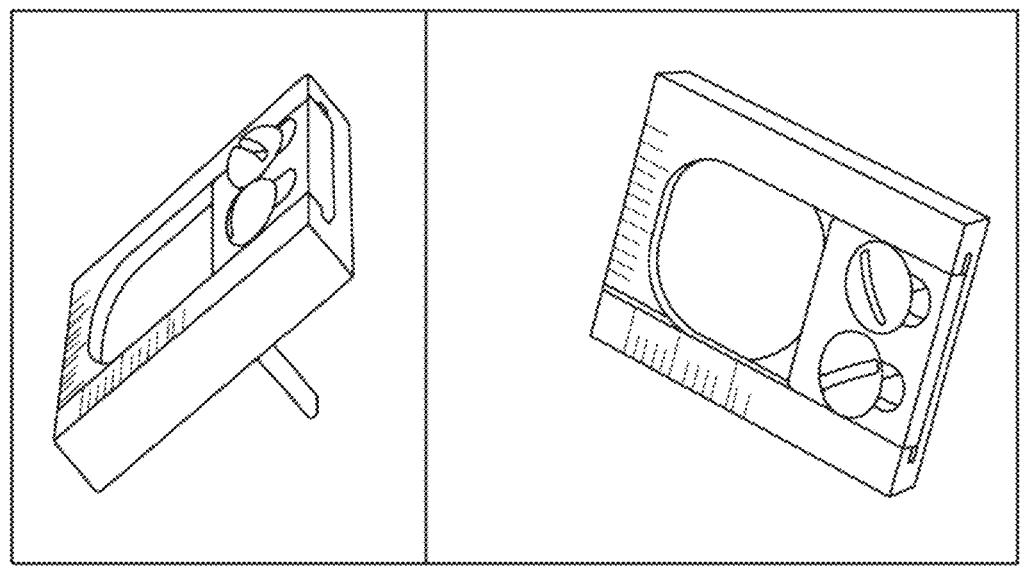

FIG. 14 displays a first example of SH for SEM and AFM of the present invention with vertical flanks and attachment block (3).

Figure 15:
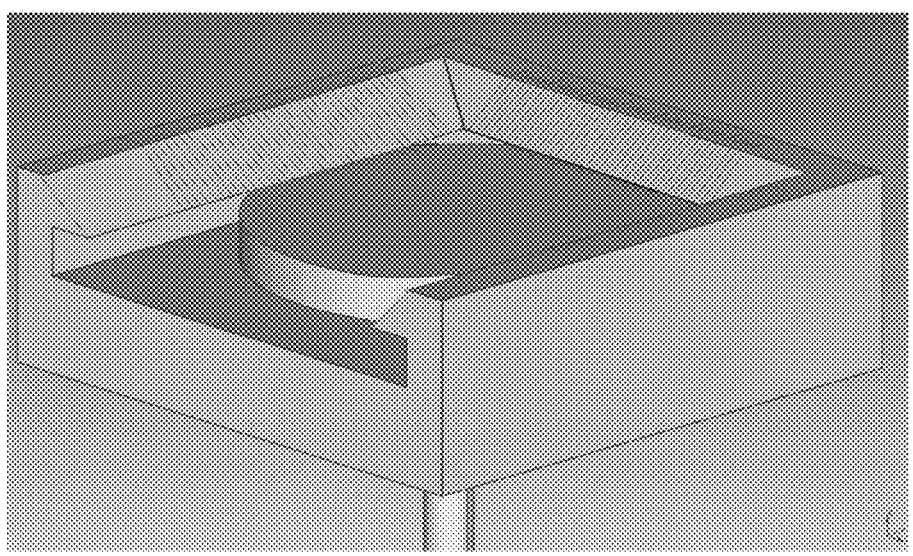

FIG. 15 is a display of SH of the present invention with scale-engraved tilted flanks, and captive screw.

Figure 16:
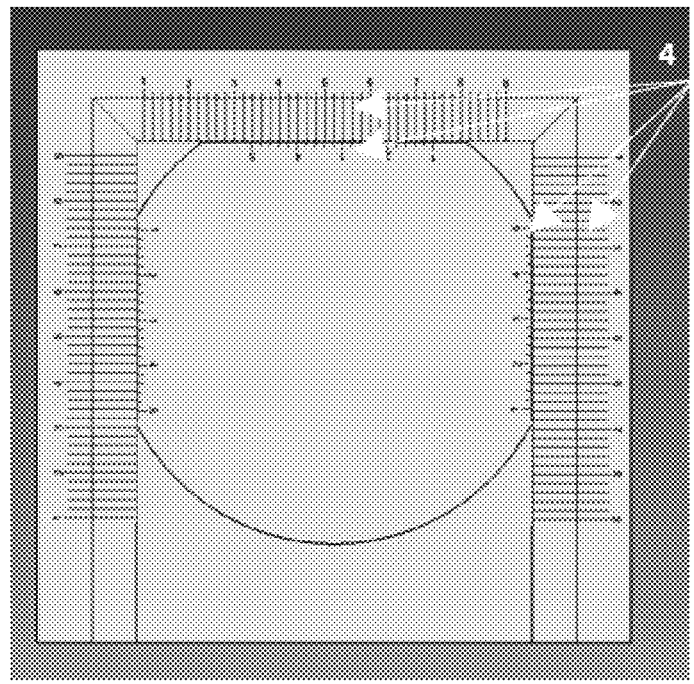

FIG. 16 shows the upper view of SH of the present invention with captive screw, highlighting the graduated scales for referencing (4).

Figure 17:
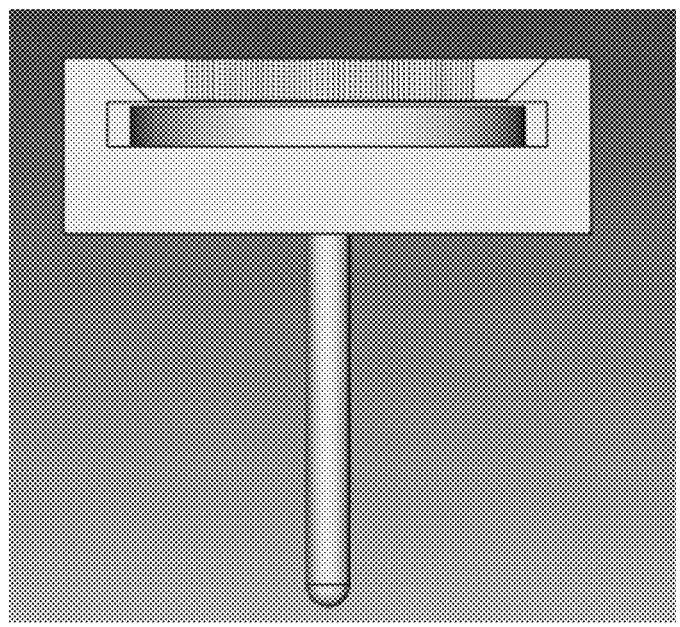

FIG. 17 shows the front view of SH of the present invention with captive screw.

Figure 18:
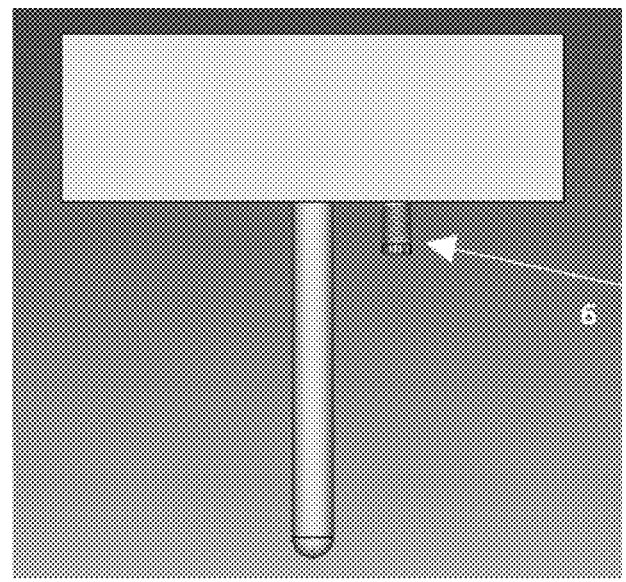

FIG. 18 shows the side view of SH of the present invention highlighting the captive screw (6).

Figure 19:
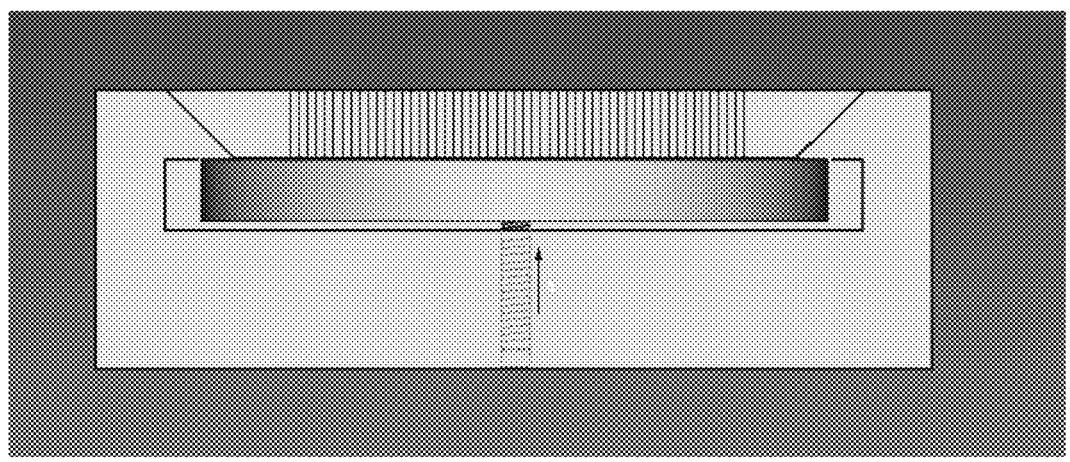

FIG. 19 shows a demonstration of the holding action with the captive screw inserted (6) in the SH of the present invention, no support pin is used for atomic force microscopes with a large chamber.

DETAILED DESCRIPTION

The present invention refers to a specimen holder (SH) designed to analyse the same sample in both, an atomic force microscope (AFM) and a scanning electron microscope (SEM), preserving the positioning reference of the sample details in both microscopies, satisfying the requirements of size, conductivity, magnetization, tidiness, referencing and adaptability.

The specimen holder from the present invention is described in the following paragraphs and presented by means of FIGS. 10 to 19, it includes:

a) A flat sample holder (SH) or AFM-SH(1) also called platen, that is magnetisable and conductive, with width and thickness that are appropriate for AFM, having circular shape or any other shape, where the sample is mounted. This platen (1) has carved on it, three mutually orthogonal graduated reference axes (4) in order to facilitate the location of specific details inside the sample and to insert it inside of a SEM-SH specially designed for this flat sample holder, as described in the following paragraphs.

b) A SH for SEM or SEM-SH(2) that is electron conductive, it has tilted flanks with three mutually orthogonal graduated reference axes carved on them (4), specially designed for the platen (1), with a box that includes two slots where a graduated platen can fit in (1). Once the platen is installed (1) on its correct location, it is fixed with one of the following mechanisms:

An attachment block is inserted (3) and fixed with bolts (FIGS. 10 to 14), and/or It is fixed with a captive screw (6) that prevents the platen from coming off and from moving (FIGS. 15 to 19).

These holding mechanisms prevent from using double-sided adhesive tape. The SEM-SH from the present invention has carved, on its upper part, three orthogonal axes (4), with mutually orthogonal tracking scales in order to pinpoint the platen axes (1) with respect to those axes.

In addition, the SEM-SH from the present invention may include a removable support pin (5), which can be employed on several other scanning electron microscopes. Some atomic force microscopes can completely accommodate the platen for AFM and the SH for the SEM without the pin, for this reason the present invention includes the option of removable support pin (5). FIG. 13 shows with clarity a Phillips-type removable support pin (5).

The design of the inclined planes and the graduated scales on them in the SEM-SH enables the scales from both AFM-SH and SEM-SH (4) converge to the same plane and thus, both scale systems can be focused at the same time, this eliminates the need of focusing the scale axes of both SEM-SH and AFM-SH independently to track features in either microscope and waste of time and effort.

In this way, the same sample, mounted on the AFM-SH(1) can be analysed on this instrument, with its details being correctly referenced to orthogonal axes, and then can be taken without dismounting the platen (1) to a SEM and be analysed on this new instrument without losing the requirements of conductivity, dimensioning, reference or functionality since it can be inclined, rotated, or translated inside the SEM. This device reduces the fundamental problem of analysing one sample with different techniques included in AFM and SEM by employing the same SH, in such a way that the results from these analyses can now be correlated.

The following is claimed:

1. A sample holder (SH) configured for use in both atomic force microscopy (AFM) and scanning electron microscopy (SEM), the sample holder comprising:

a flat platen configured to hold a sample for atomic force microscopy (AFM), wherein the flat platen is magnetisable and conductive, with appropriate width and thickness for AFM, and wherein the flat platen includes an AFM reference scale carved on the flat platen and including three graduated AFM reference axes each arranged orthogonal to an adjacent one of the three graduated AFM reference axes; and a SEM sample holder that is electron conductive, and that includes a box that includes two slots sized and positioned to slidably receive the flat platen, a SEM reference scale carved on the SEM sample holder and including three SEM reference axes each arranged orthogonal to an adjacent one of the three SEM reference axes, and a removable support pin extending from a surface of the SEM sample holder.

2. The sample holder (SH) from claim 1, where the flat platen is circular.

3. The sample holder (SH) from claim 2, further comprising an attachment block selectively couplable to the SEM sample holder with one or more bolts and/or screws, wherein the attachment block, when coupled to the SEM sample holder while the flat platen is slidably received by the box of the SEM sample holder, secures the flat platen to the SEM sample holder.

4. The sample holder (SH) from claim 1, wherein the AFM reference scale and the SEM reference scale are configured to align when the flat platen is slidably received by the SEM sample holder to preserve a sample-features location reference when a sample is analysed in both atomic force microscopy and scanning electronic microscopy.

5. The sample holder (SH) from claim 2, further comprising a captive screw selectively couplable to the SEM sample holder and configured to secure the flat platen to the SEM sample holder when the flat platen is slidably received by the box of the SEM sample holder.

6. The sample holder (SH) from claim 1, further comprising an attachment block selectively couplable to the SEM sample holder, wherein the attachment block, when coupled to the SEM sample holder while the flat platen is slidably received by the box of the SEM sample holder, secures the flat platen to the SEM sample holder.

7. The sample holder (SH) from claim 1, further comprising a captive screw selectively couplable to the SEM sample holder and configured to secure the flat platen to the SEM sample holder when the flat platen is slidably received by the box of the SEM sample holder.

* * * * *